United States Patent
Koo et al.

(10) Patent No.: US 7,196,747 B2
(45) Date of Patent: Mar. 27, 2007

(54) FLAT PANEL DISPLAY COMPRISING SEMICONDUCTOR LAYER WITH HETEROGEOUS LINES

(75) Inventors: Jae-Bon Koo, Yongin (KR); Ji-Yong Park, Suwon (KR); Sang Il Park, Seoul (KR); Hye-Dong Kim, Seongnam (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/754,546

(22) Filed: Jan. 12, 2004

(65) Prior Publication Data

US 2004/0218109 A1     Nov. 4, 2004

(30) Foreign Application Priority Data

Apr. 29, 2003    (KR)  ................. 10-2003-0027071

(51) Int. Cl.
     *G02F 1/136*      (2006.01)

(52) U.S. Cl. ............ 349/42; 349/43; 257/59; 257/66; 257/72; 257/74; 345/92

(58) Field of Classification Search ............ 349/42–43; 257/59, 72, 66, 74; 345/92; 438/30, 166, 438/463, 482

See application file for complete search history.

(56) References Cited

U.S. PATENT DOCUMENTS

| | | | |
|---|---|---|---|
| 6,194,254 B1 | 2/2001 | Takemura | |
| 6,303,963 B1 * | 10/2001 | Ohtani et al. ............... | 257/350 |
| 6,456,013 B1 | 9/2002 | Komiya et al. | |
| 2002/0102821 A1 | 8/2002 | Voutsas | |
| 2003/0001157 A1 | 1/2003 | Yamada et al. | |
| 2003/0067458 A1 | 4/2003 | Anzai | |

FOREIGN PATENT DOCUMENTS

| | | |
|---|---|---|
| EP | 1 298 634 A2 | 4/2003 |
| JP | 05-034723 | 2/1993 |
| JP | 08-201846 | 8/1996 |
| JP | 09-050961 | 2/1997 |
| JP | 10-012891 | 1/1998 |
| JP | 10-107291 | 4/1998 |
| JP | 2001-102595 | 4/2001 |
| JP | 2002-175029 | 6/2002 |
| JP | 2002-176063 | 6/2002 |
| JP | 2003-108032 | 4/2003 |
| KR | P2001-0067258 | 7/2001 |
| KR | P2002-0040613 | 5/2002 |

* cited by examiner

*Primary Examiner*—David Nelms
*Assistant Examiner*—(Nancy) Thanh-Nhan P Nguyen
(74) *Attorney, Agent, or Firm*—H.C. Park & Associates, PLC

(57) ABSTRACT

Provided is a flat panel display in which no stripes appear on a screen, thereby improving image quality. The flat panel display has a matrix-type array of sub-pixels, each of which includes a driving thin film transistor, a first electrode driven by the driving thin film transistor, and a second electrode driving a light emission unit together with the first electrode. The driving thin film transistor includes semiconductor channels which are derived from a semiconductor layer. Heterogeneous straight lines are separated from each other on the semiconductor layer. An imaginary line connecting the semiconductor channels of one column is not parallel to the heterogeneous straight lines.

13 Claims, 13 Drawing Sheets

FLAT PANEL DISPLAY COMPRISING SEMICONDUCTOR LAYER WITH HETEROGEOUS LINES

RELATED APPLICATIONS

This application claims priority from Korean Patent Application No. 2003-27071, filed on Apr. 29, 2003, in the Korean Intellectual Property Office, the disclosure of which is incorporated herein by reference in its entirety.

FIELD OF THE INVENTION

The present invention relates to a flat panel display, and more particularly, to an active matrix flat panel display with a driving thin film transistor.

BACKGROUND OF THE RELATED INVENTION

Figure 1:
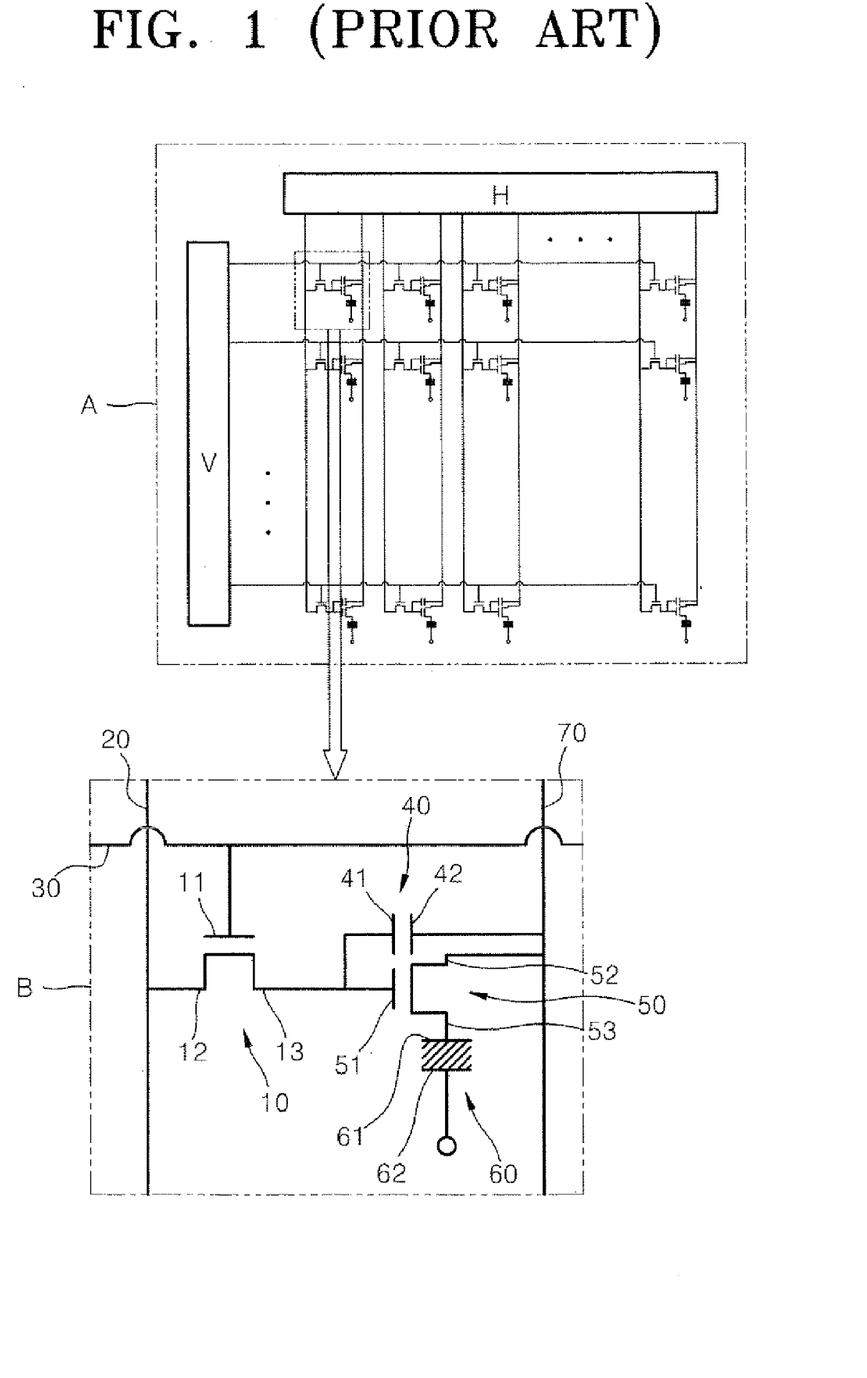
FIG. 1 is a circuit view of a flat panel display.
Figure 2:
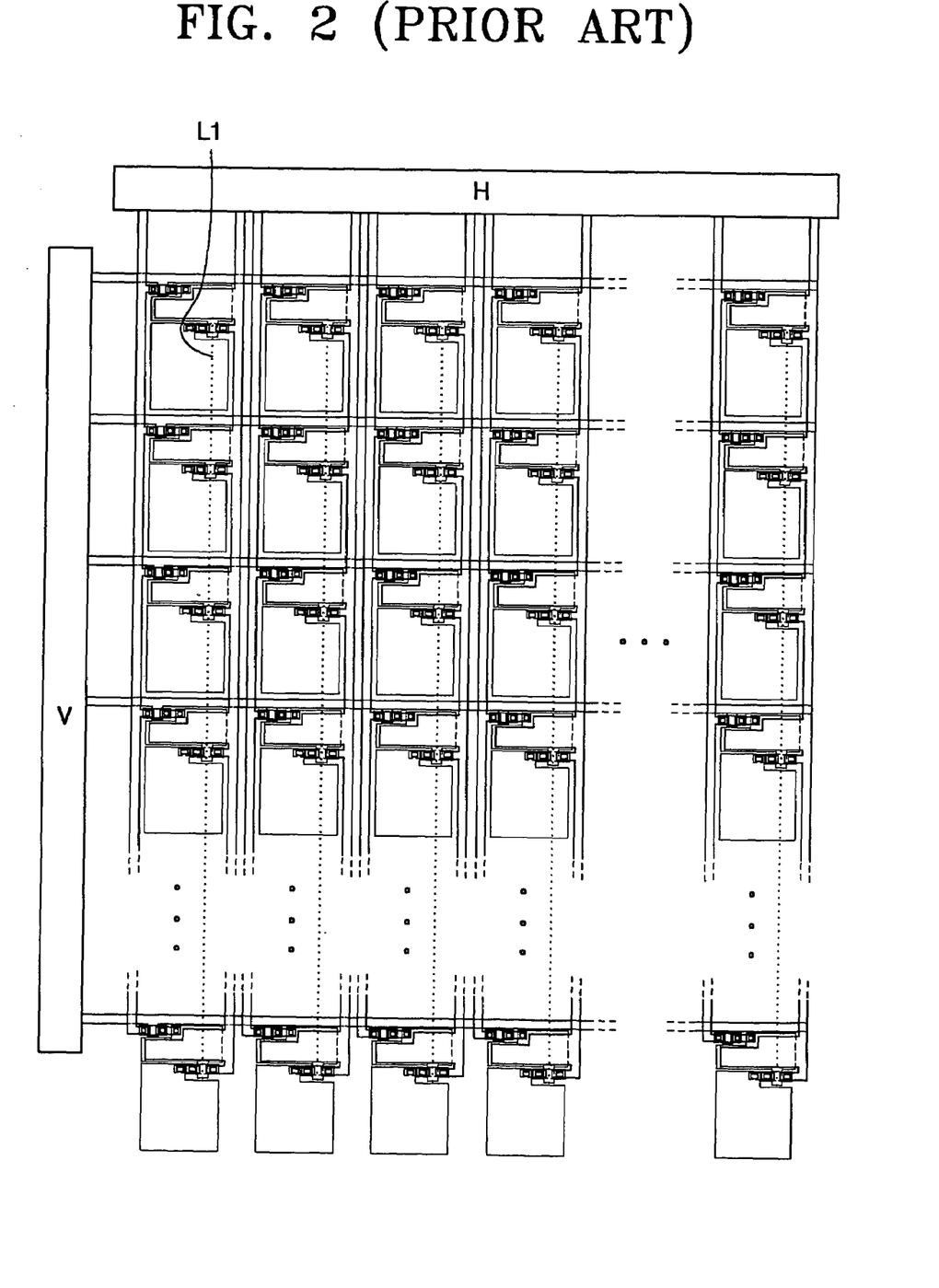
FIG. 2 is a schematic view of part "A" of FIG. 1.
Figure 3:
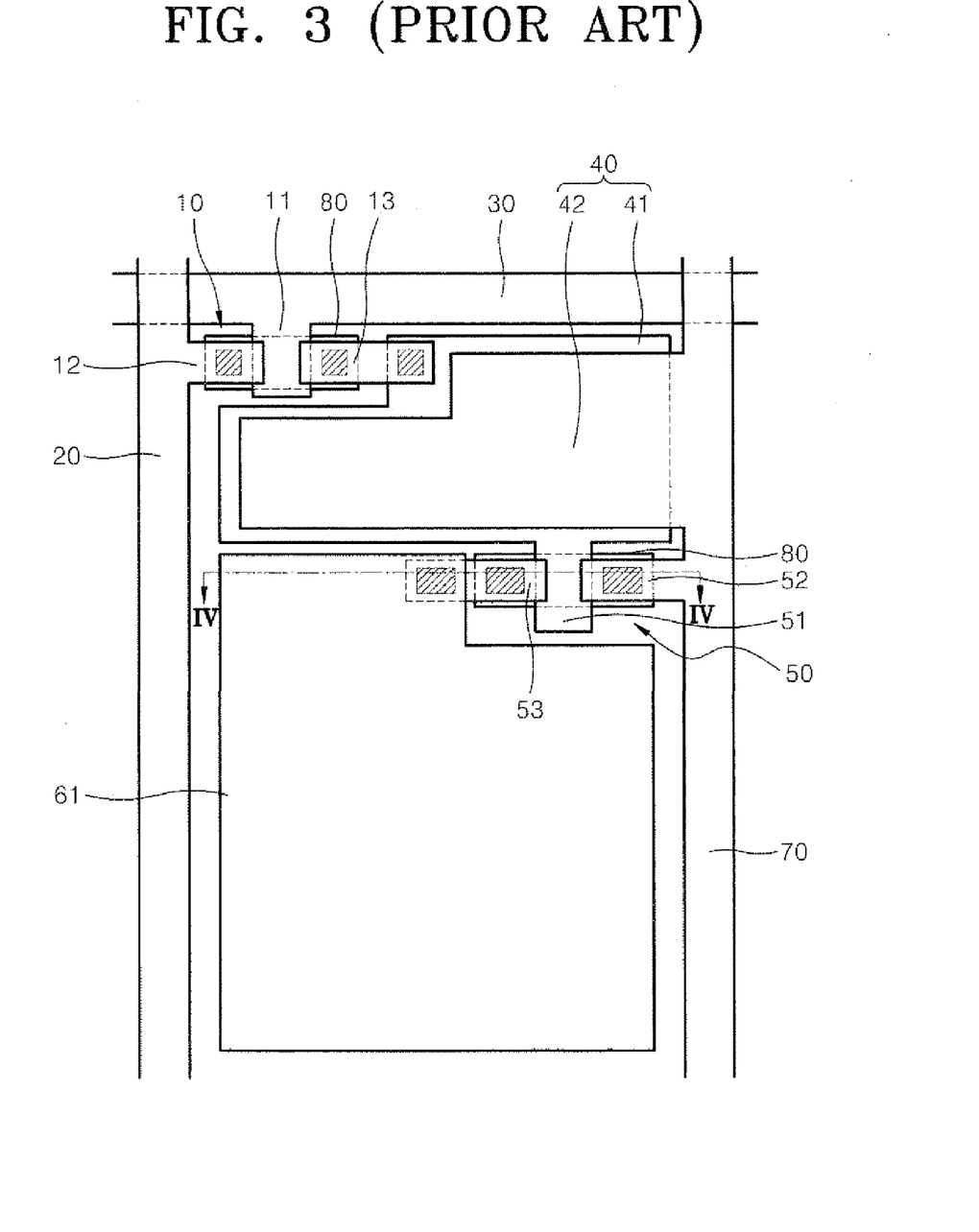
FIG. 3 is a schematic view of part "B" of FIG. 1.
Figure 4A:
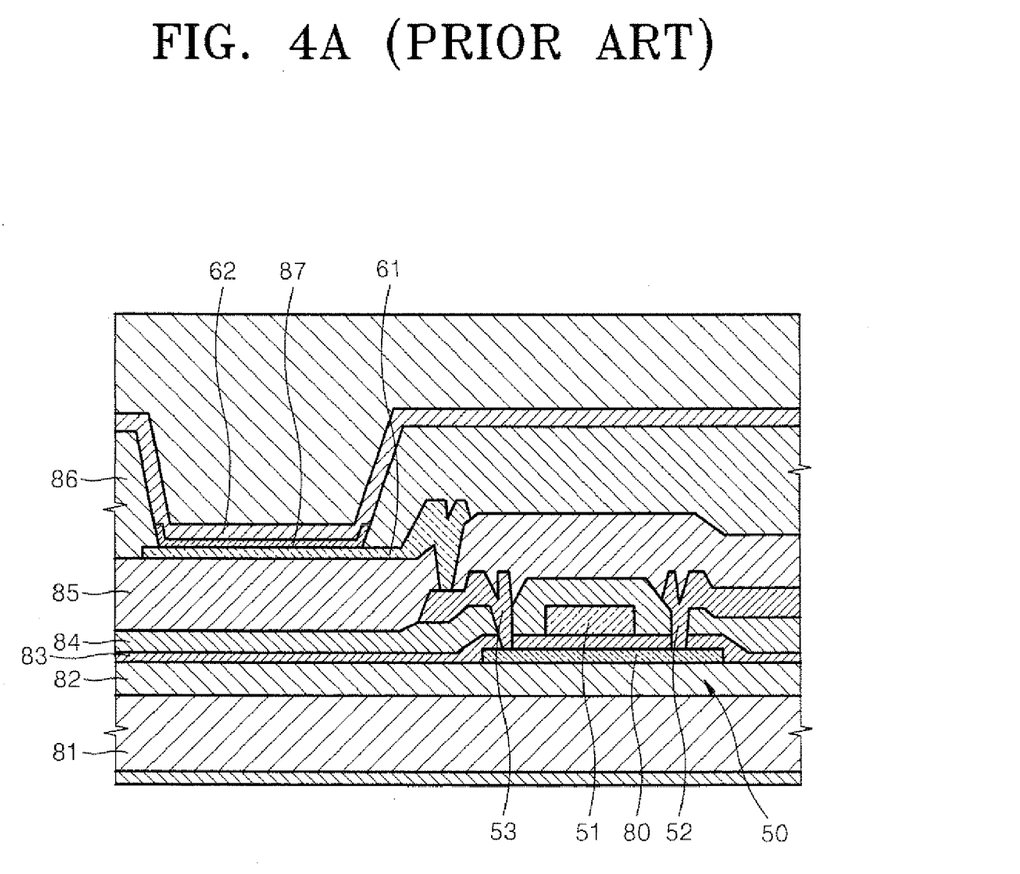
FIG. 4A is a sectional view of an electroluminescent display taken along line IV—IV in FIG. 3.
Figure 4B:
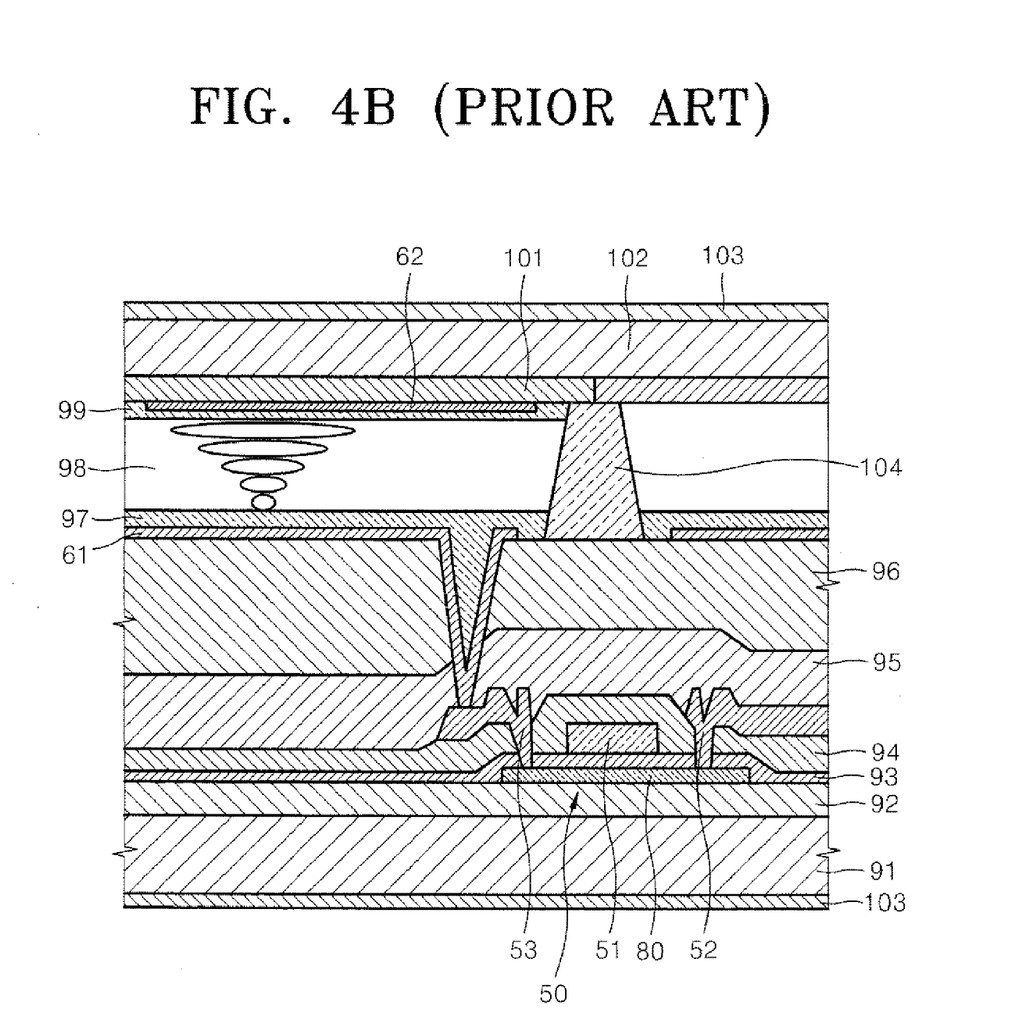
FIG. 4B is a sectional view of a liquid crystal display taken along line IV—IV in FIG. 3.

FIG. 1 is a circuit view of a conventional flat panel display. FIG. 2 is a schematic view of part "A" of FIG. 1, and FIG. 3 is a schematic view of part "B" of FIG. 1. A driving thin film transistor (TFT) 50 shown in FIG. 3 has a section as shown in FIGS. 4A and 4B. A flat panel display of FIG. 4A is an electroluminescent display and a flat panel display of FIG. 4B is a liquid crystal display. An electroluminescent display and a liquid crystal display have the same or similar driving TFT structure.

Figure 5:
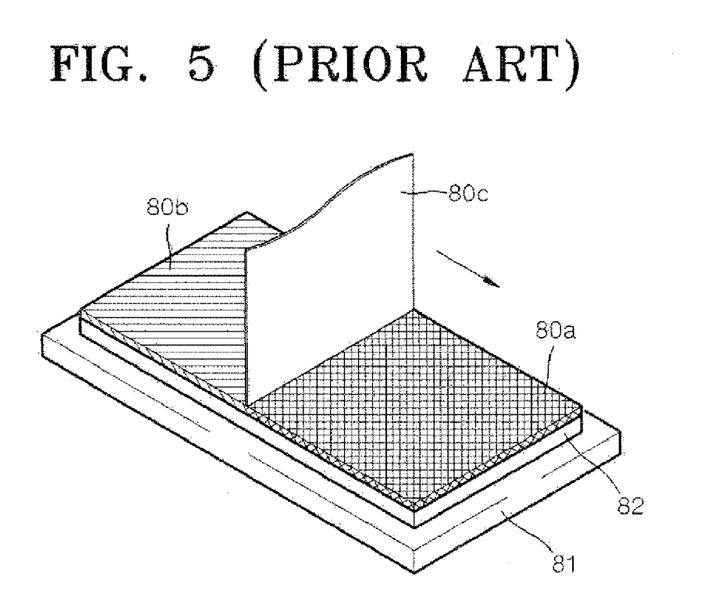
FIG. 5 is a perspective view of a crystallization process for a semiconductor layer.

As shown in FIGS. 4A and 4B, semiconductor channels 80 serve as electrical connection channels for driving TFTs 50 and are formed on buffer layers 82 and 92 which cover substrates 81 and 91, respectively. When these semiconductor channels are derived from a polycrystalline semiconductor layer, an amorphous semiconductor layer 80a is crystallized into a polycrystalline semiconductor layer 80b by radiation of a laser beam 80c, as shown in FIG. 5. A crystallization process for a semiconductor layer may use a laser, i.e., an excimer laser annealing process is disclosed in U.S. Pat. No. 6,495,405. In this crystallization, in order to crystallize a wide amorphous semiconductor layer using a narrow laser beam, the laser beam shifts in a lateral direction of the amorphous semiconductor layer, i.e., in the direction of the arrow of FIG. 5 at a predetermined distance. In this case, a shift distance of the amorphous semiconductor layer is smaller than the width of the laser beam. Conventionally, the laser beam shifts at a distance corresponding to 1% to 15% of the width of the laser beam. In this regard, the overlap of the laser beam takes place in 80 to 99% of the amorphous semiconductor layer. When crystallization is carried out in this way, a region of the amorphous semiconductor layer is subjected to laser beam irradiation several times to several tens of times.

Figure 6:
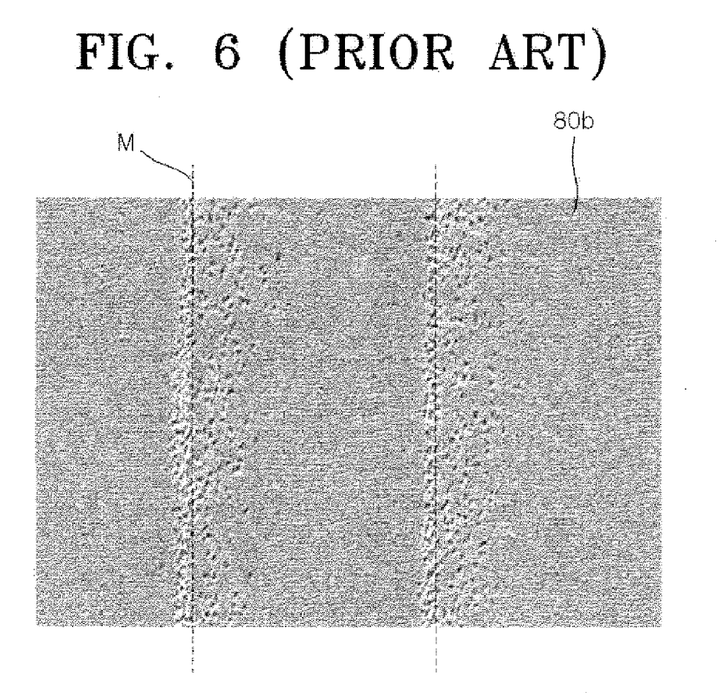
FIG. 6 is a plan view of a semiconductor layer after a crystallization process.
Figure 7:
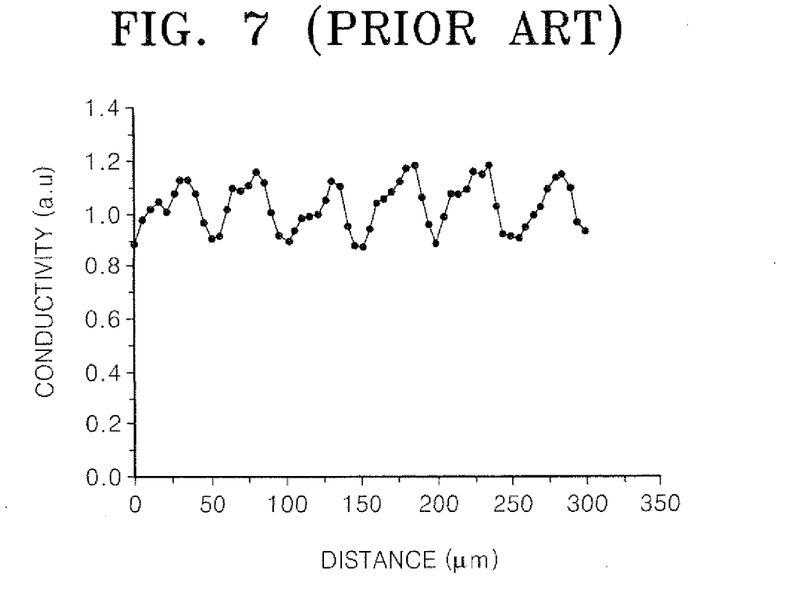
FIG. 7 is a graph of a change of conductivity according to a distance in a semiconductor layer after a crystallization process.

Stripes M are formed on a polycrystalline semiconductor layer obtained in this way, as shown in FIG. 6. Such stripes have characteristics different from the other areas of the polycrystalline semiconductor layer, and are hereinafter referred to as "heterogeneous straight lines." These heterogeneous straight lines M may be caused by instability of the laser beam and uneven laser radiation in edge portions. These heterogeneous straight lines have different conductivity from the other areas of the polycrystalline semiconductor layer according to the operation condition of a driving TFT, thereby causing unevenness of luminance distribution of an image. This fact is demonstrated by a graph (in a 90% overlap condition) of a change of conductivity according to a distance in a semiconductor layer as illustrated in FIG. 7. As shown in FIG. 7, conductivity periodically varies depending on positions of the heterogeneous straight lines.

Figure 8:
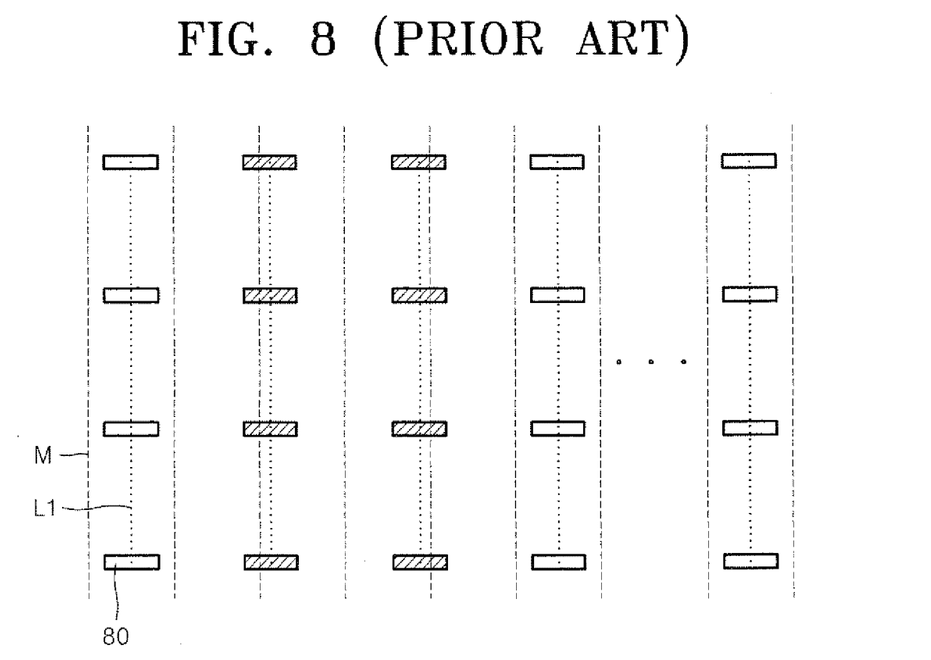
FIG. 8 is a schematic view of an array of semiconductor channels in a conventional flat panel display.

FIG. 8 shows a several column (L1) array of semiconductor channels formed in a conventional flat panel display regardless of positions of heterogeneous straight lines. In FIG. 8, while semiconductor channels with heterogeneous straight lines are represented by filled rectangles, semiconductor channels with no heterogeneous straight lines are represented by empty rectangles. In this regard, while some columns of semiconductor channels comprise no heterogeneous straight lines, the other columns of semiconductor channels comprise heterogeneous straight lines. Due to such an array of semiconductor channels, the semiconductor channels have different conductivities. For this reason, even though the same signal is supplied to the sub-pixels, there are luminance differences between light emission units of sub-pixels having driving TFTs with heterogeneous straight lines and light emission units of sub-pixels having driving TFTs with no heterogeneous straight lines. Therefore, there arises a problem in that stripes appear on a screen, thereby lowering image quality.

SUMMARY OF THE INVENTION

The present invention provides a flat panel display in which no stripes appear on a screen, and thus, image quality is improved.

According to an aspect of the present invention, there is provided a flat panel display having a matrix-type array of sub-pixels, each of which comprises a driving thin film transistor. A first electrode driven by the driving thin film transistor, and a second electrode driving a light emission unit together with the first electrode are also provided, wherein the driving thin film transistor comprises semiconductor channels which are derived from a semiconductor layer, and heterogeneous straight lines are separated from each other on the semiconductor layer. An imaginary line connecting the semiconductor channels of one column is not parallel to the heterogeneous straight lines.

The imaginary line connecting the semiconductor channels of one column may be a non-straight line, and, according to an embodiment of the invention, may be a zig-zag line. A zig-zag line may have a regular or irregular zig-zag pattern. The zig-zag line may have a two-step zig-zag pattern or a three-step zig-zag pattern.

The heterogeneous straight lines may be separated from each other by the same distance and the width of the zig-zag line may be larger than the distance between adjacent two of the heterogeneous straight lines.

According to another aspect of the present invention, there is provided a flat panel display having a matrix-type array of sub-pixels, each of which comprises a driving thin film transistor, a first electrode driven by the driving thin film transistor, and a second electrode driving a light emission unit together with the first electrode. The driving thin film transistor comprises semiconductor channels which are derived from a semiconductor layer. Heterogeneous straight lines are separated from each other on the semiconductor layer, and wherein each of the semiconductor channels comprises at least one of the heterogeneous straight lines. The semiconductor channels may comprise the same number of the heterogeneous straight lines.

Each of the semiconductor channels may have a length equal to a value obtained by multiplying the width of a laser beam used to irradiate crystal amorphous silicon into polycrystalline silicon by the percentage of the area of the semiconductor layer at which the overlap of the laser beam does not occur.

According to yet another aspect of the present invention, there is provided a flat panel display having a matrix-type array of sub-pixels, each of which comprises a driving thin film transistor, a first electrode driven by the driving thin film transistor, and a second electrode driving a light emission unit together with the first electrode. The driving thin film transistor comprises semiconductor channels which are derived from a semiconductor layer. Heterogeneous straight lines are separated from each other on the semiconductor layer, and wherein the semiconductor channels are positioned between the heterogeneous straight lines.

The heterogeneous straight lines may be separated from each other by the same distance.

According to the present invention, no stripes appear on a screen, thereby obtaining a flat panel display with improved image quality.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Embodiments of the present invention will be described in detail with reference to the accompanying drawings.

Figure 9:
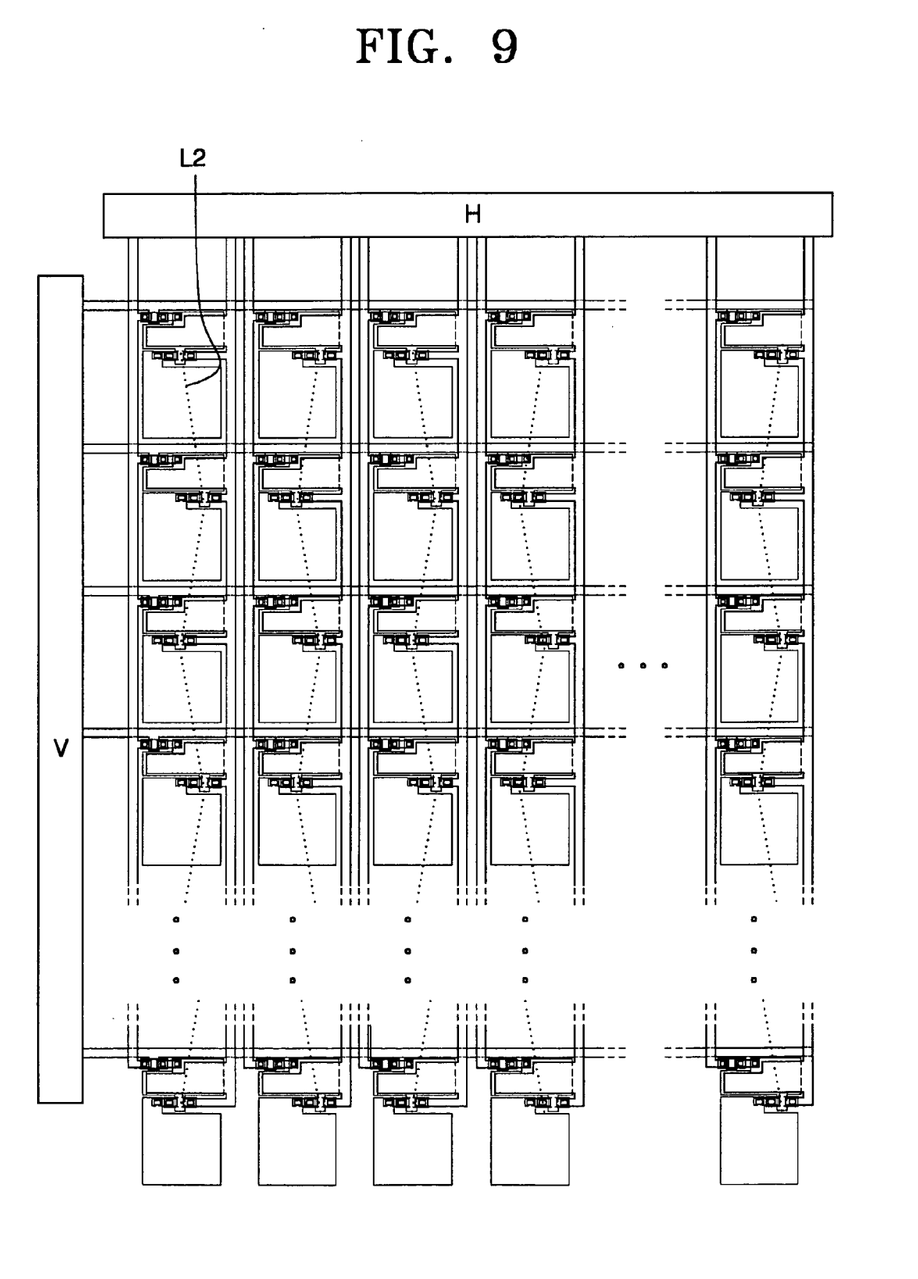
FIG. 9 is a schematic view of a flat panel display according to an embodiment of the present invention, corresponding to FIG. 2.
Figure 10:
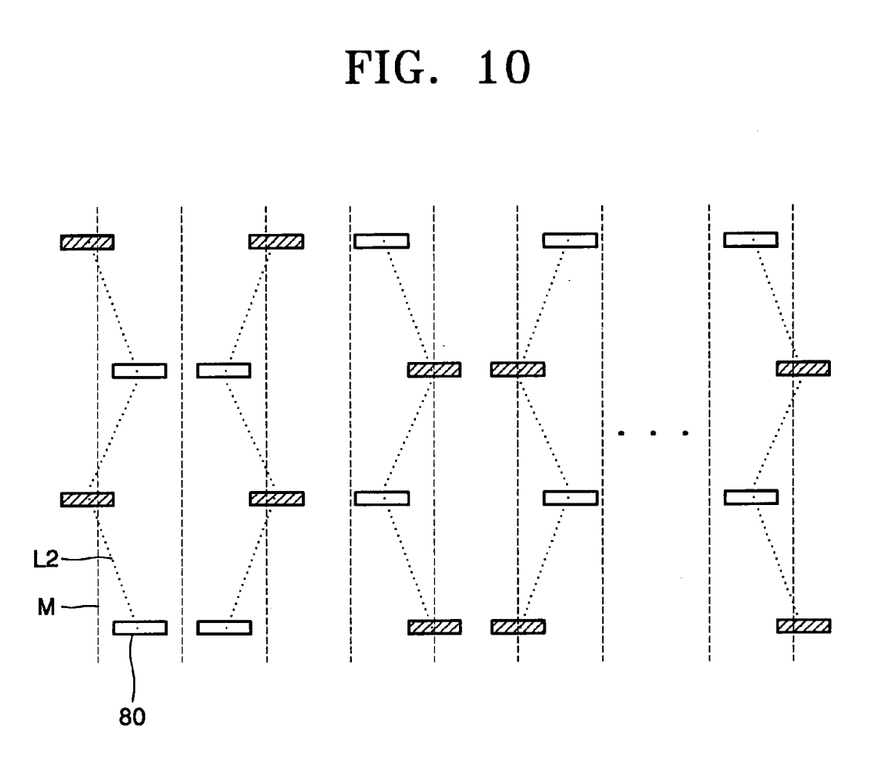
FIG. 10 is a schematic view of an array of semiconductor channels in a flat panel display according to an embodiment of the present invention, corresponding to FIG. 8.

FIG. 9 shows sub-pixels in a flat panel display according to an embodiment of the present invention and FIG. 10 shows an array of semiconductor channels in the flat panel display according to an embodiment of the present invention. A circuit view of the flat panel display is as shown in FIG. 1 and a schematic structure of one of the sub-pixels is as shown in FIG. 3. As an example of the flat panel display, an electroluminescent display is shown in FIG. 4A and a liquid crystal display is shown in FIG. 4B.

The flat panel display comprises a matrix-type array of sub-pixels, each of which comprises a driving thin film transistor (TFT) 50, a first electrode 61 driven by the driving TFT, and a second electrode 62 driving a light emission unit together with the first electrode. Semiconductor channels 80 of the driving TFT are formed by etching a semiconductor layer 80b made of polycrystalline silicon. Heterogeneous straight lines M are formed at a predetermined distance from each other on the semiconductor layer. Therefore, while some of the semiconductor channels may comprise the heterogeneous straight lines, the other semiconductor channels may not comprise the heterogeneous straight lines. Generally, the heterogeneous straight lines are separated from each other by the same distance. However, the distances between the heterogeneous straight lines may be different.

The driving TFT 50 is individually connected to each of the sub-pixels to form a matrix-type array. First direction arrays of the driving TFTs are arrayed in a second direction perpendicular to the first direction to thereby form a matrix-type array. The term "first direction" used herein may be a direction extended from, for example, a third conductive line 70 or a direction perpendicular thereto. The semiconductor channels, each of which is one constitutional element of the driving TFT, are also arrayed in a matrix form.

According to this embodiment, the semiconductor channels are arrayed in such a way that an imaginary line L2 connecting the semiconductor channels of one column is not parallel to the heterogeneous straight lines. For this, the semiconductor channels may be arrayed in various methods. For example, a diagonal array of the semiconductor channels of one column may be used so that the semiconductor channels can wholly have a diagonal array (not shown). In this case, an imaginary line connecting the semiconductor channels of one column is a straight line. However, since a predetermined angle is defined by the imaginary line and the heterogeneous straight lines, the imaginary line connecting the semiconductor channels of one column is not parallel to the heterogeneous straight lines.

Another method is to array the semiconductor channels in such a way that an imaginary line connecting the semiconductor channels of one column is not a straight line. A representative example is a zig-zag array method illustrated in FIGS. 9 and 10. In this case, an imaginary line connecting the semiconductor channels of one column is a regular zig-zag line L2. In this embodiment of the present invention, the heterogeneous straight lines are separated from each other by the same distance. In this regard, it is preferable to set the width of the zig-zag line, i.e., a horizontal distance from the rightmost point to the leftmost point of the imaginary line L2 connecting the semiconductor channels of one column may be larger than the distance between adjacent two of the heterogeneous straight lines M. According to an embodiment of the invention, if the width of the zig-zag line is too narrow, the imaginary line L2 may be substantially close to a straight line.

In FIG. 10, while the semiconductor channels with the heterogeneous straight lines are represented by filled rectangles, the semiconductor channels with no heterogeneous straight lines are represented by empty rectangles. Since the semiconductor channels are arrayed in regular zig-zag pattern, as shown in FIG. 10, may prevent a phenomenon that all of the semiconductor channels of one column comprise the heterogeneous straight lines. The zig-zag pattern of FIG. 10 may also prevent the phenomenon that no semiconductor channels of one column comprise the heterogeneous straight lines. Therefore, a luminance difference depending on the presence or absence of the heterogeneous straight lines does not occur by columns, but is distributed on a whole screen. Consequently, in a display operation, no stripes appear on a screen. When sub-pixels with a luminance difference are evenly distributed on a whole screen, it may be difficult to discern a luminance difference with the naked eye, and improve image quality.

According to an embodiment of the present invention, groups comprised of two or more adjacent semiconductor channels may be arrayed in zig-zag pattern. That is, a two-step zig-zag (left-right) pattern, as shown in FIG. 10, may also be accomplished by repeatedly positioning two continuous semiconductor channels on a left side and two continuous semiconductor channels on a right side. It is understood that groups comprised of three semiconductor channels may also be arrayed in zig-zag pattern.

Hereinafter, a general construction and an operation of a flat panel display will be described.

FIG. 1 shows an example of a circuit used in a flat panel display. The circuit comprises a switching TFT 10, a driving TFT 50, a storage capacitor 40, and a light emission unit 60. A first source electrode 12 in the switching TFT is connected to a horizontal driving circuit H through a first conductive line 20. A first gate electrode 11 in the switching TFT is connected to a vertical driving circuit V through a second conductive line 30. A first drain electrode 13 in the switching TFT is connected to a first capacitor electrode 41 of the storage capacitor and a second gate electrode 51 of the driving TFT. A second capacitor electrode 42 of the storage capacitor and a second source electrode 52 of the driving TFT are connected to a third conductive line 70. A second drain electrode 53 of the driving TFT is connected to a first electrode 61 of the light emission unit. A second electrode 62 of the light emission unit is arranged opposite the first electrode and separated from the first electrode by a predetermined gap. An organic material layer, an inorganic material layer, or a liquid crystal layer may be arranged between the first and second electrodes according to the type of flat panel displays.

FIG. 3 illustrates a sub-pixel having the switching TFT 10 and the driving TFT 50 in a flat panel display. For the sake of simplicity, only conductive constitutional elements are shown in FIG. 3. Therefore, nonconductive constitutional elements such as substrates 81 and 91, buffer layers 82 and 92, various types of insulating layers 83, 84, and 85, a planarization layer 86, a light emission layer 87, a liquid crystal layer 98, a second electrode 62, a polarization layer 103, orientation layers 97 and 99, and a color filter layer 101 are omitted. These nonconductive constitutional elements are shown in FIGS. 4A and 4B. Only constitutional elements positioned at regions represented by oblique lines shown in FIG. 3 are electrically connected to each other.

When a voltage is applied to the first gate electrode 11, a conductive channel is formed in a semiconductor channel which connects the first source electrode 12 and the first drain electrode 13. When charge is supplied to the first source electrode through the first conductive line, the charge may move into the first drain electrode 13. Charge for determining the luminance of a sub-pixel flows through the third conductive line 70. When the charge for the first drain electrode is supplied to the second gate electrode 51, the charge for the second source electrode 52 moves into the second drain electrode 53, thereby driving the first electrode 53 of the light emission unit. The storage capacitor 40 serves to maintain the driving operation of the first electrode and/or increase a driving speed. The switching TFT and the driving TFT may have a similar section structure, but have different adjoining constitutional elements.

An electroluminescent display shown in FIG. 4A comprises a substrate 81, a driving TFT 50, a first conductive line 20, a second conductive line 30, a first electrode 61, a light emission layer 87, and a second electrode 62. In the case of a rear emission type electroluminescent display, the substrate 81 may be made of a transparent material, for example glass, and the second electrode may be made of a metal material such as aluminium with good reflectivity. On the other hand, in the case of a front emission type electroluminescent display, the second electrode may be made of a transparent conductive material, for example, indium tin oxide (ITO), and the first electrode may be made of a metal material with good reflectivity.

A buffer layer 82 is formed on the whole surface of the substrate 81. A semiconductor layer 80b is formed on the buffer layer 82. A first insulating layer 83 is formed on the semiconductor layer and a second gate electrode 51 is formed to a predetermined pattern on the first insulating layer 83. A second insulating layer 84 is formed on the second gate electrode 51 and on the remaining exposed surface of the first insulating layer 83 on which the second gate electrode 51 is not formed. After the formation of the second insulating layer 84, the first and second insulating layers 83 and 84 are subjected to etching, such as dry etching, to form a semiconductor channel 80. The semiconductor channel 80 is connected to a second source electrode 52 and a second drain electrode 53, which are formed in a predetermined pattern. After the formation of the second source and drain electrodes 52 and 53, a third insulating layer 85 is formed thereon. A portion of the third insulating layer 85 is etched to electrically connect the second drain electrode 53 and the first electrode 61. After the formation of the first electrode on the third insulating layer, a planarization layer 86 is formed. The portion of the planarization layer 86 corresponding to the first electrode is etched. Then, the light emission layer 87 is formed on the first electrode and the second electrode 62 is formed on the light emission layer.

The driving TFT 50 comprises the second source electrode 52, the second drain electrode 53, the second gate electrode 51, and the semiconductor channel 80. Generally, the second source electrode 52 and the second drain electrode 53 are arranged on the same horizontal plane and separated from each other by a predetermined gap. They are connected to the semiconductor channel 80 to electrically connect each other through the semiconductor layer 80. The second gate electrode 51 is insulated from the second source electrode 52, the second drain electrode 53, and the semiconductor channel 80. The second gate electrode 51 is positioned above the semiconductor channel and between the second source and drain electrodes. Meanwhile, a TFT is classified into a staggered type, an inverted staggered type, a coplanar type, and an inverted coplanar type according to the arrangements of the above electrodes and the semiconductor layer. While a coplanar type is illustrated in this embodiment of the present invention, the present invention is not limited thereto. According to this embodiment of the present invention, the first conductive line corresponds to a data line for transmitting data and the second conductive line corresponds to a scan line.

The structure of an electroluminescent display will be described in detail with reference to FIG. 4A. As shown in FIG. 4A, an electroluminescent display comprises the first electrode 61, the light emission layer 87 formed on the first electrode 61, and the second electrode 62 formed on the light emission layer 87. An electroluminescent display can be divided into organic and inorganic electroluminescent displays. With respect to an organic electroluminescent display, the light emission layer is largely comprised of an electron transport layer, a light emission material layer, and a hole transport layer. With respect to an inorganic electroluminescent display, insulating layers are interposed between the first electrode and the light emission layer and between the second electrode and the light emission layer.

The light emission layer of an organic electroluminescent display is made of an organic material, for example, phthalocyanine such as copper phthalocyanine (CuPc), N,N'-di (naphthalene-1-yl)-N,N'-diphenyl benzidine (NPB), and/or tris-8-hydroxyquinoline aluminium (Alq3). When charge is supplied to the first electrode and the second electrode, holes and electrons recombine with each other to generate excitons. When the excitons are changed from an excited state to a ground state, the light emission material layer emits light.

Regarding an inorganic electroluminescent display, an inorganic material layer between the insulating layers positioned at inner sides of the first and second electrodes emits light. An inorganic material for the inorganic material layer may be metal sulfide such as ZnS, SrS, and/or CsS. Alkaline earth-based calcium sulfide such as $CaCa_2S_4$ and $SrCa_2S_4$, and/or metal oxide may also be used. Light emitting core atoms of transition metal, such as Mn, Ce, Tb, Eu, Tm, Er, Pr, Pb and/or alkaline rare earth metal may also be used to form the light emission layer together with the above inorganic material. When a voltage is applied to the first and second electrodes, electrons are accelerated. The accelerated electrons collide with the light emitting core atoms. Electrons of the light emitting core atoms may be excited to a higher energy level and then fall back to a ground state. Accordingly, the inorganic material layer emits light.

A liquid crystal display will now be described with reference to FIG. 4B only in terms of differences from an electroluminescent display. A liquid crystal display comprises a first substrate 91, a driving TFT 50, a first conductive line 20, a second conductive line 30, a first electrode 61, a first orientation layer 97, a second substrate 102, a second electrode 62, a second orientation layer 99, a liquid crystal layer 98, and a polarization layer 103. The first substrate corresponds to the substrate 81 of an electroluminescent display. The first substrate 91 and the second substrate 102 are separately manufactured. A color filter layer 101 is formed on the lower surface of the second substrate 102. The second electrode 62 is formed on the lower surface of the color filter layer 101. The first orientation layer 97 and the second orientation layer 99 are formed on the upper surface of the first electrode 61 and the lower surface of the second electrode 62, respectively. The first and second orientation layers 97 and 99 lead to proper orientation of a liquid crystal of the liquid crystal layer 98 interposed therebetween. The polarization layer 103 may be formed on each of the outer surfaces of the first and second substrates. A spacer 104 may be used to maintain a gap between the first and second substrates.

A liquid crystal display allows light to pass through or be blocked according to the arrangement of a liquid crystal. The arrangement of the liquid crystal is determined by an electric potential difference between the first and second electrodes. Light that has passed through the liquid crystal layer exhibits a color of the color filter layer 101, thereby displaying an image.

Figure 11:
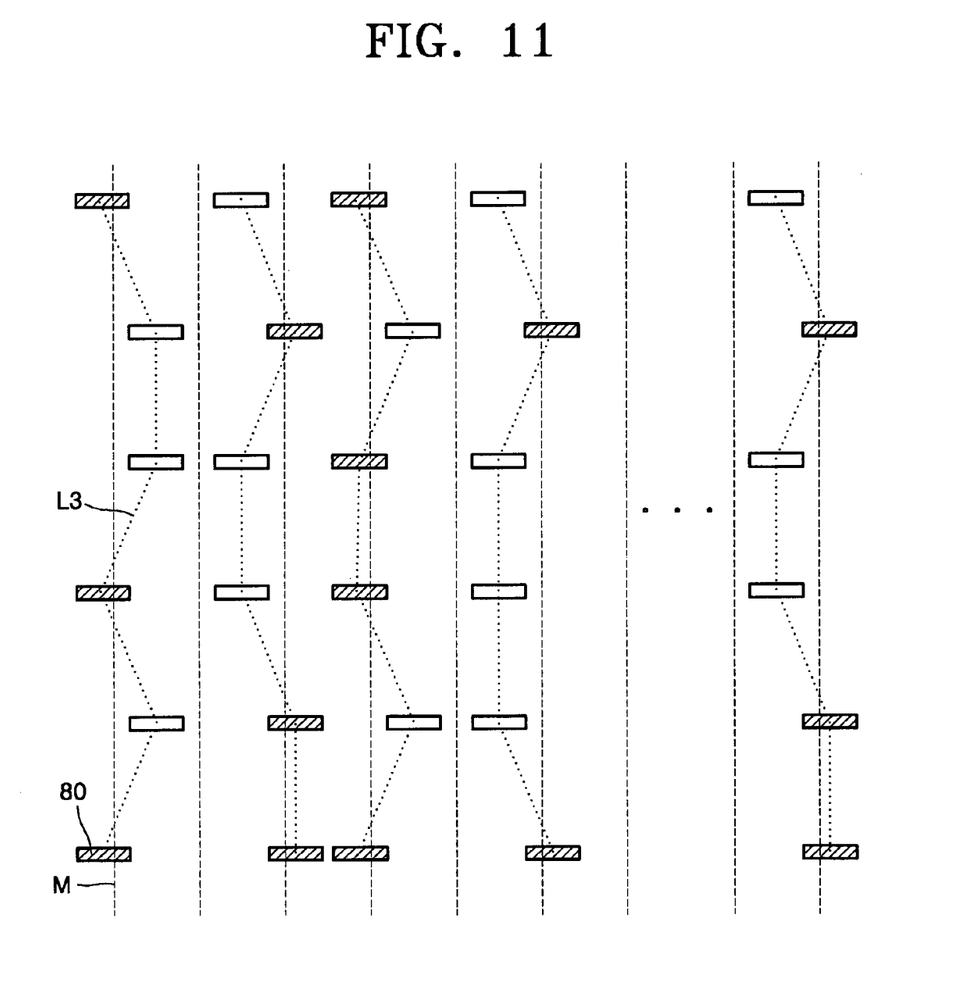
FIG. 11 is a schematic view of an array of semiconductor channels in a flat panel display according to an embodiment of the present invention, corresponding to FIG. 8.

An embodiment of the present invention will be described only in terms of differences from the first embodiment with reference to FIG. 11. This embodiment is different from the first embodiment in that a zig-zag pattern L3 of semiconductor channels is irregular. Since an array of semiconductor channels according to the present invention is not limited to a regular zig-zag (left-right) pattern, an irregular zig-zag pattern is also within the scope of the present invention. Even though semiconductor channels are arrayed in an irregular zig-zag pattern, similar advantages as those found in other embodiments may be obtained.

Figure 12:
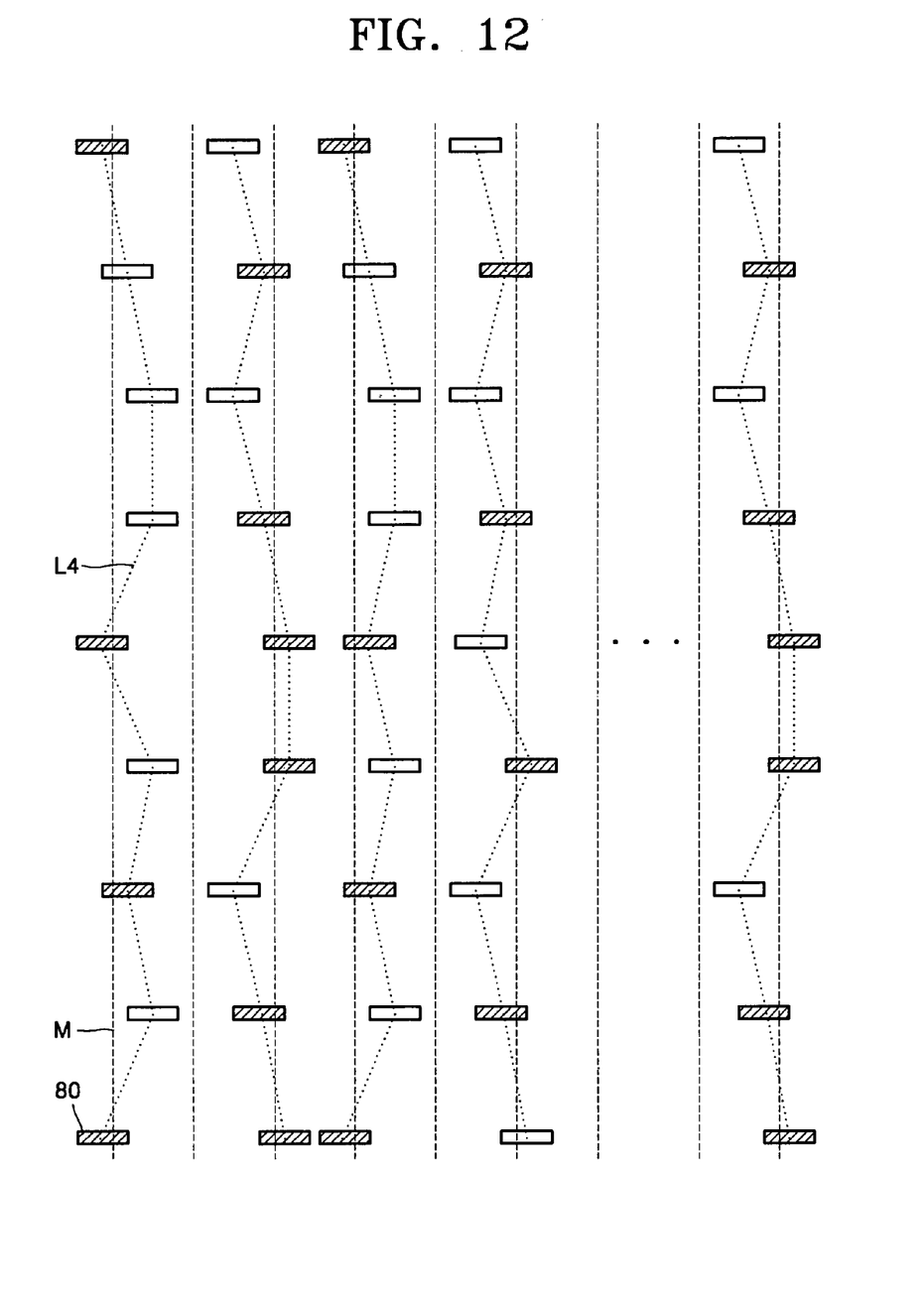
FIG. 12 is a schematic view of an array of semiconductor channels in a flat panel display according to an embodiment of the present invention, corresponding to FIG. 8.

Another embodiment of the present invention will be described only in terms of differences from other embodiments with reference FIG. 12. This embodiment differs in that semiconductor channels are arrayed in an irregular three-step zig-zag pattern L4. Since an array of semiconductor channels according to the present invention is not limited to a two-step zig-zag pattern, such an irregular three-step zig-zag pattern is also within the scope of the present invention. Even though semiconductor channels are arrayed in an irregular three-step zig-zag pattern, similar advantages as those found in the other embodiments may also be obtained. As a modified example of this embodiment, semiconductor channels of one column may be arrayed in a regular three-step zig-zag pattern. A three-step zig-zag array of semiconductor channels of one column may also provide advantages similar to those found in other embodiments. Such a three-step zig-zag array may be advantageous in particular when the distances between heterogeneous straight lines are large.

Figure 13:
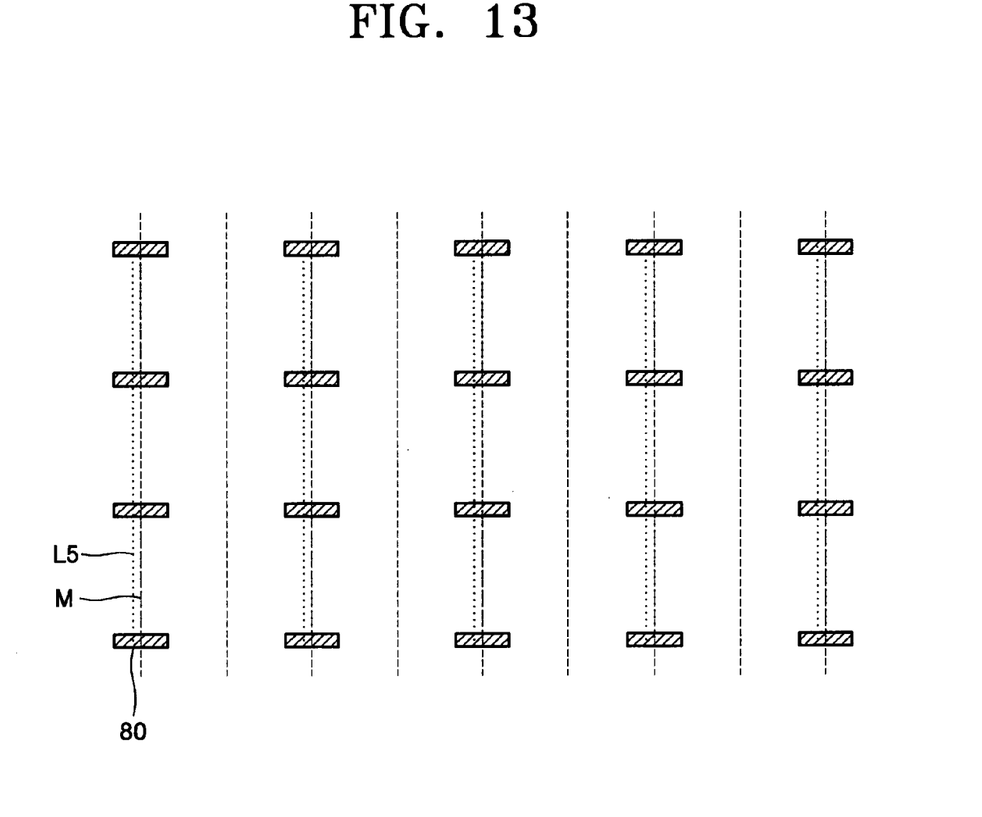
FIG. 13 is a schematic view of an array of semiconductor channels in a flat panel display according to an embodiment of the present invention, corresponding to FIG. 8.

A further embodiment of the present invention may be described in terms of differences from other embodiments with reference to FIG. 13. This embodiment differs in that every semiconductor channels 80 comprises heterogeneous straight lines.

A flat panel display according to this embodiment of the present invention may have a matrix-type array of sub-pixels, each of which comprises a driving TFT, a first electrode driven by the driving TFT, and a second electrode driving a light emission unit together with the first electrode. The driving TFT comprises a semiconductor layer intended for formation of the semiconductor channels and the heterogeneous straight lines may be formed at a predetermined distance from each other on the semiconductor layer. Each of the semiconductor channels comprises at least one of the heterogeneous straight lines.

The semiconductor channels may be arrayed along a straight line L5 instead of being arrayed in a zig-zag pattern, and each of the semiconductor channels comprises at least one of the heterogeneous straight lines M. FIG. 13 shows that each of the semiconductor channels comprises one heterogeneous straight line. However, each of the semiconductor channels may comprise two or more heterogeneous straight lines, which is also within the scope of the present invention. Furthermore, since it is not required that the semiconductor channels comprise the same number of the heterogeneous straight lines, some semiconductor channels may comprise only one heterogeneous straight line and the other semiconductor channels may comprise two or more heterogeneous straight lines. However, the semiconductor channels may be set to have the same number of heterogeneous straight lines to decrease a luminance difference between sub-pixels.

According to an embodiment of the present invention, a horizontal distance between the semiconductor channels may be equal to an integral multiple of a horizontal distance between heterogeneous straight lines. Also, when the semiconductor channels are formed after the formation of a semiconductor layer, each of the semiconductor channels may have at least one of heterogeneous straight lines. Each of the semiconductor channels may have a length equal to a value obtained by multiplying the width of a laser beam irradiated for crystallization of amorphous silicon into polycrystalline silicon by the percentage of the area of the semiconductor layer at which overlap of the laser beam does not occur.

According to an embodiment of the present invention, since the semiconductor channels have the same number of heterogeneous straight lines, there is no luminance difference between sub-pixels, thereby ensuring good image quality.

A further embodiment of the present invention will be described only in terms of differences from the other embodiments mentioned above with reference to FIG. 14. This embodiment differs in that no semiconductor channels 80 have heterogeneous straight lines. That is, the semiconductor channels are positioned between heterogeneous straight lines. The semiconductor channels may be arrayed along a straight line L6 instead of being arrayed in a zig-zag pattern.

Figure 14:
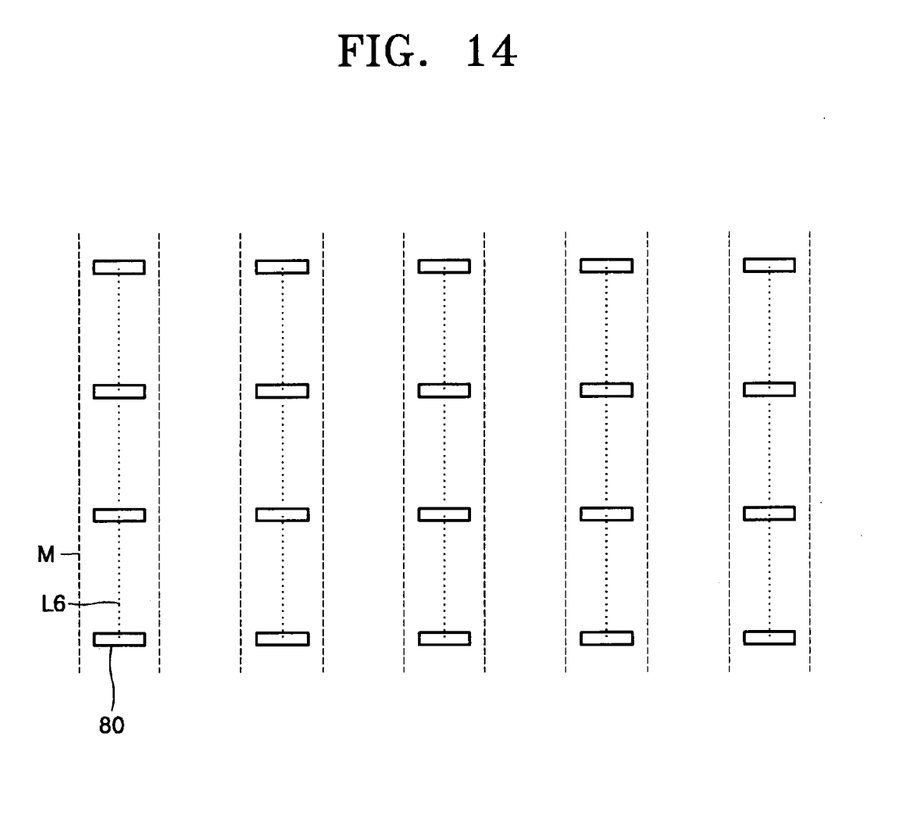
FIG. 14 is a schematic view of an array of semiconductor channels in a flat panel display according to an embodiment of the present invention, corresponding to FIG. 8.

In this embodiment of the present invention, a horizontal distance between the semiconductor channels may be equal to an integral multiple of a horizontal distance between heterogeneous straight lines. Also, when the semiconductor channels are formed after the formation of a semiconductor layer, the semiconductor channels may be positioned between heterogeneous straight lines.

In this embodiment of the present invention, since no semiconductor channels have heterogeneous straight lines, there may be no luminance difference between sub-pixels, thereby ensuring good image quality.

As is apparent from the above description, the present invention provides a flat panel display in which formation of stripes due to a luminance difference is reduced or prevented. Therefore, image quality may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display having a matrix-type array of sub-pixels, each of which comprises a driving thin film transistor, a first electrode driven by the driving thin film transistor, and a second electrode driving a light emission unit together with the first electrode,
wherein the driving thin film transistor comprises semiconductor channels which are derived from a semiconductor layer, and heterogeneous straight lines are separated from each other on the semiconductor layer, wherein at least one of the semiconductor channels comprise at least one of the heterogeneous straight lines, and wherein an imaginary line connecting the semiconductor channels of one column is not parallel to the heterogeneous straight lines.

2. The flat panel display according to claim 1, wherein the imaginary line connecting the semiconductor channels of one column is in a non-straight line.

3. The flat panel display according to claim 2, wherein the imaginary line connecting the semiconductor channels of one column is a zig-zag line.

4. The flat panel display according to claim 3, wherein the zig-zag line has a regular zig-zag pattern.

5. The flat panel display according to claim 3, wherein the zig-zag line has a non-uniform zig-zag pattern.

6. The flat panel display according to claim 3, wherein the zig-zag line has a two-step zig-zag pattern.

7. The flat panel display according to claim 3, wherein the zig-zag line has a three-step zig-zag pattern.

8. The flat panel display according to claim 1, wherein heterogeneous straight lines are separated from each other by the same distance.

9. The flat panel display according to claim 3, wherein the heterogeneous straight lines are separated from each other by the same distance and the width of the zig-zag line is larger than the distance between adjacent two of the heterogeneous straight lines.

10. A flat panel display having a matrix-type array of sub-pixels, each of which comprises a driving thin film transistor, a first electrode driven by the driving thin film transistor, and a second electrode driving a light emission unit together with the first electrode,
wherein the driving thin film transistor comprises semiconductor channels which are derived from a semiconductor layer, and heterogeneous straight lines are separated from each other on the semiconductor layer, and wherein each of the semiconductor channels comprises at least one of the heterogeneous straight lines.

11. The flat panel display according to claim 10, wherein the semiconductor channels comprise the same number of the heterogeneous straight lines.

12. The flat panel display according to claim 11, wherein each of the semiconductor channels has a length equal to a value obtained by multiplying the width of a laser beam irradiated for crystallization of amorphous silicon into polycrystalline silicon by the percentage of the area of the semiconductor layer at which overlap of the laser beam does not occur.

13. The flat panel display according to claim 10, wherein the heterogeneous straight lines are separated from each other by the same distance.

* * * * *